United States Patent [19]
Bergmann et al.

[11] Patent Number: 4,889,772
[45] Date of Patent: Dec. 26, 1989

[54] COMPOSITE MATERIAL HAVING A SLIDE LAYER APPLIED BY CATHODE SPUTTERING

[75] Inventors: Erich Bergmann, Mels, Switzerland; Jurgen Braus, Walldor, Fed. Rep. of Germany

[73] Assignee: Balzers Aktiengesellschaft, Furstentum, Liechtenstein

[21] Appl. No.: 136,295

[22] Filed: Dec. 22, 1987

[30] Foreign Application Priority Data

Dec. 23, 1986 [CH] Switzerland .................. 05157/86

[51] Int. Cl.$^4$ ............................................. B22F 3/00
[52] U.S. Cl. ................................. 428/547; 428/553; 428/610; 384/910; 427/287; 427/295
[58] Field of Search ................... 428/547, 553, 610; 384/910; 427/287, 295

[56] References Cited

U.S. PATENT DOCUMENTS

| | | |
|---|---|---|
| 3,467,588 | 9/1969 | Gebler et al. |
| 4,387,140 | 6/1983 | Kondo et al. |
| 4,505,987 | 3/1985 | Yamada et al. |
| 4,732,818 | 3/1988 | Pratt et al. |

FOREIGN PATENT DOCUMENTS

| | | |
|---|---|---|
| 2853724 | 7/1981 | Fed. Rep. of Germany . |
| 2914618 | 9/1983 | Fed. Rep. of Germany . |
| 3404880 | 8/1986 | Fed. Rep. of Germany . |
| 54-28232 | 3/1979 | Japan .................. 428/553 |
| 59-100263 | 6/1984 | Japan .................. 428/553 |

Primary Examiner—Stephen J. Lechert, Jr.
Attorney, Agent, or Firm—McGlew & Tuttle

[57] ABSTRACT

For some applications of slide layers, for example in connecting rod bearings of internal combustion engines, for individual sites of a formed piece, high load bearing capability are required while for other places of the same formed piece good embedding abilities are demanded. A composite material with a slide layer applied by cathode sputtering of a tightly cohesive matrix and an insoluble component distributed statistically in it, is adapted to these opposite demands in that the diameter of the particle of the insoluble material has gradients at predetermined sites, which extend parallel to the surface of the slide layer, and to which slide layer hardness gradients correspond. These gradients are generated during the cathode sputtering process in the substrate to be coated to form a growing slide layer having temperature gradients which are maintained and which extend parallel to the substrate surface.

10 Claims, 3 Drawing Sheets

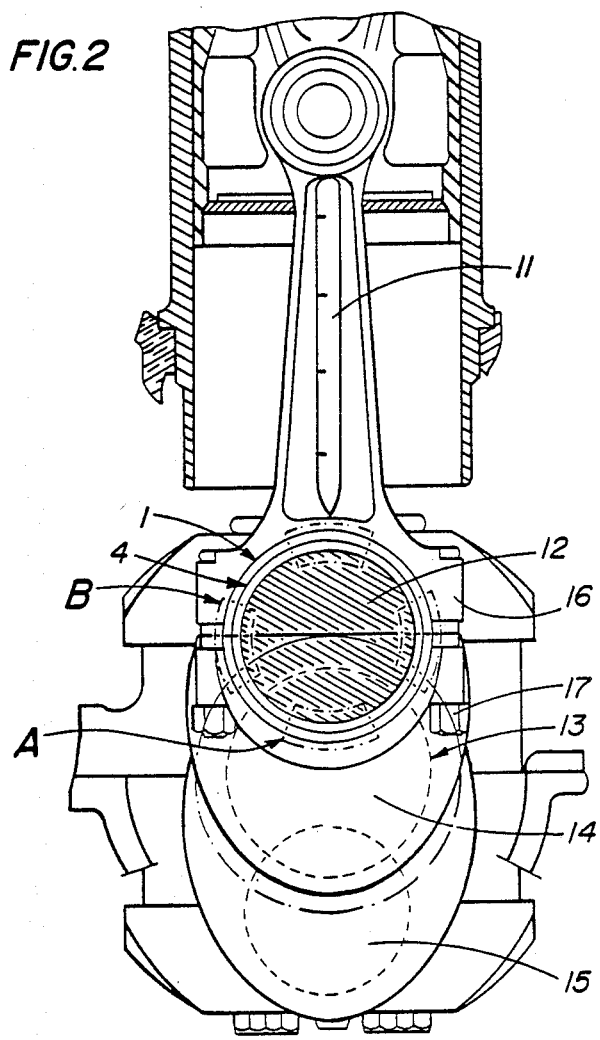

COMPOSITE MATERIAL HAVING A SLIDE LAYER APPLIED BY CATHODE SPUTTERING

FIELD AND BACKGROUND OF THE INVENTION

The invention relates in general to sliding surface articles and in particular to a composite material with at least one slide layer, applied by cathode sputtering, of a mixture of particles deposited in statistical distribution of at least one metallic material forming a firmly connected matrix and at least one additional metallic material, which in the solid state is practically insoluble in the matrix material. It relates further to a method for manufacturing such composite materials as well as use of the same in friction bearing shells.

As surface layers slide layers of composite materials are used, for example, for bearing shells of internal combustion engines and must, in addition to others, have the following properties: lower hardness than the material of the shaft, high strength with respect to alternating dynamic stress, high shearing resistance, heat stability of the mechanical properties as well as high corrosion resistance. These requirements are fulfilled, among others, by compositions of lead or tin with metals, which lend the layer mechanical strength by forming a cohesive matrix, they are themselves corrosion resistant and do not process solubility for tin or lead, like aluminum, chromium, or nickel, for example. Such composite materials having lead or tin containing slide layers as well as methods for their manufacture through cathode sputtering are described in German patent Nos. 28 53 724 and 29 14 618 as well as in German OS No. 34 04 880.

When using such slide layers as surface layers, high opposite demands are frequently made of the particular preform or machine part. If applied for friction bearings they should, at least at particular sites, transfer the forces to which the bearing is subjected, with sufficient long life, onto the surrounding structure (load bearing capacity) in order to tolerate the surface pressure of the connecting rods. This requires relatively high heat-stable hardness of the particular slide layers and 70 HV 0.002 has been shown to represent a critical values, which should not be fallen below. Also, from other places of the same machine part, particularly from its slide layers, good embedding response is demanded, i.e. the ability to withstand embedding of dirt or wear and tear particles into the surface. Through such property the danger of damage to the slide surfaces is decreased. In order to meet this demand, the slide layers should not be too hard. Based on experience, hardness of 70 HV 0002 represents also in this connection a critical value, which already requires relatively elaborate measures to protect the particular bearing from entering dirt particles and to keep the lubricant clean through filtration.

In the case of the slide layers described in the state of the art applied by cathode sputtering such contradictory demands made of one and the same machine or preform part cannot be met, since the slide layers in question have identical properties over their entire surface.

SUMMARY OF THE INVENTION

The present invention provides composite materials having slide layers applied by cathode sputtering, which can fulfill optimum use for different sites of the same machine, or preform operations with entirely opposite demands regarding the material and in particular can combine good embedding response at particular sites with good load bearing capacities in others.

The task is solved through a composite material according to the invention, which has the following features:

The diameter of the particles of the material insoluble in the matrix has at predetermined sites gradients, (changes in value) which extend parallel to the surface of the slide layer. To these gradients of the particular diameter (changes in the particular diameter) correspond gradients of hardness of the particular slide layer (changes in the hardness).

The invention builds on the finding that the degree of hardness of a slide layer is a function of the particle size of the material insoluble in the matrix and that a small particle diameter corresponds to a high degree of hardness and a larger particle diameter to a lesser degree of hardness. Therefore, if a slide layer is needed, which at given sites has a high degree of hardness and correspondingly good load bearing ability, at other sites a low degree of hardness corresponding to good embedding capacity, then the particle size of the material insoluble in the matrix must be varied appropriately, which can be effected by generating appropriate gradients of this particle size extending parallel to the surface of the slide layer. For the mentioned material combinations (matrix: Al, Cr, Ni, insoluble: Sn, Pb) it has been shown to be of advantage, if the mean of the statistical normal distribution of the diameter of the insoluble particles varies in the region of the gradients between 0.2 $\mu$m and 10 $\mu$m. At those sites of the slide layer, at which highest load bearing capacity and correspondingly highest hardness is required, the diameter of the particles of the insoluble material has advantageously a statistical normal distribution with a mean value of $\bar{x} < 0.8$ $\mu$m, preferably within a range between $0.05 < \bar{x} < 0.4$ $\mu$m. This corresponds to an approximately ten times finer distribution of the particles containing the insoluble material at the places of greatest load bearing ability compared to the layers disclosed in the state of the art. If for instance, AlSn2oCu produced by continuous casting, has a hardness of 35 HV 0.01, the layers according to the invention achieve at these hardest sites a hardness of at least 180 HV 0.002 (cf. German patent No. 28 53 724, column 6). As to particulars, the invention is developed so that at the component insoluble in the matrix at least one of the relatively low melting elements tin (MP 231.89 ° C.), lead (MP 327.4 ° C.) can be utilized. For special applications, however, other low melting metals and their alloys are not excluded: cadmium (MP 320.9 ° C.), thallium (MP 302 ° C.), zinc (MP 419.5 ° C.), and even gallium (MP29.8 ° C.). The invention yields particular advantages for composite materials, in which the matrix-forming component contains a conventional friction bearing alloy, the primary components of which contain one of the following elements: aluminum, chromium, nickel, magnesium, copper. It has been shown that it is particularly effective, if the slide layer as a whole has a composition with one of the following combinations: AlCuSn, AlCuPb, AlCuSnPb, AlSiSn, AlSiPb, AlSiSnPb, CuSn, CuPb, CuSnPb. Slide layers in accordance with the invention have preferentially layer thicknesses between 10 and 30 $\mu$m, with the lower half of this range (12 to 16 $\mu$m), being satisfactory for most applications. The optimum layer thickness suggested by the state of the art for conventional two-component slide layers of 18 m could not be confined in this respect (cf. U. Engel, in: SAE Technical Paper Series, International Congress and Exposition, Detroit 1986, page 76).

From the state of the art (German patent No. 29 14 618, column 5, German patent No. 28 53 724, column 5) is further known, the oxide concentrations between 0.1 and 0.5 volume percent in a so-called dispersion hardening of the particular slide layers. In contrast, it has been demonstrated, surprisingly, that layers according to the invention, in the manufacture of which appropriate measures were taken (use of targets manufactured in an atmosphere of inert gases) to lower the oxygen concentration to less than 0.2 weight percent, at the sites having the smallest particle diameter of the insoluble components indicate significantly improved mechanical properties compared to the known dispersion-hardened slide layers. The approximately ten times finer distribution of these particles in the matrix of the slide layers hence replaces to some extent the hardening through dispersed oxide particles.

Surprisingly, it was found, that the slide layers according to the invention in contrast to the layers disclosed in the state of the art receive, through a combination of this, approximately a ten times finer distribution of the insoluble component with an oxygen concentration in the entire slide layer significantly increased tempering properties. While heat treatment for 300 hours at 170° C. with conventional slide layers leads to a significant decrease of the degree of hardness (cf. German patent No. 28 53 724), the hardness at these sites of the layers according to the invention falls during such heat treatment only to a negligible extent. Through such combination the particular sites of the slide layer achieve with an approximately ten times finer distribution of the undetachable component and with 2.5 times the oxygen concentration a hardness of 100 HV 0.002.

In addition, these sites of the layers according to the invention show when compared to those disclosed in the state of the art, improved tempering properties.

Through this high oxygen concentration in the layer extensive enveloping of the finely dispersed insoluble particles by O-atoms is achieved and these decrease the danger, that these finely dispersed particles re-aggregate through grain changes, in turn, to larger particles and in this way the advantageous properties of the slide layers according to the invention are partially lost through aging. The conditions at the time the slide layer was generated are, in other words, stabilized by such high oxygen concentrations in the course of time. On this connection rests the substantially increased strength, compared to conventionally oxygen-doped layers—of the slide layers according to the invention under alternating dynamic stress as well as the increased heat resistance of the mechanical properties of these layers. Here it must be considered that for effective enveloping of very finely distributed particles, with correspondingly large total surface area, more oxygen atoms are required than for enveloping the same mass more coarsely distributed and having a correspondingly smaller total surface area.

Corresponding to the specific function of the preformed part to be coated, the hardness gradients and thus the sites of differing hardness of the slide layer according to the invention, can be distributed in any geometric configuration over the entire surface of the slide layer. In many applications, annular zones of extremely high hardness are required, which demand corresponding hardness gradients of annular outline, in which the areas of greatest hardness lie in the interior of the annulus.

The invention relates further to a method for manufacturing the suggested composite materials, in which the slide layer is applied by the cathode sputtering method. The task in this part of the invention consisted in generating gradients of the diameter of the insoluble particles in the slide layer and thus gradients of hardness of it with good reproducibility in any geometric configurations and within the largest possible range of the variation of particle diameter respectively surface hardness.

This task is solved according to the invention, in that during the process of cathode sputtering temperature gradients are generated in the substrate to be coated and in the corresponding slide layer itself and maintained, which extend parallel to the surface of the substrate. Such temperature gradients can advantageously be generated in that the substrate to be coated during the cathode sputtering process is strongly cooled at different sites with the greatest cooling capability brought about at those sites, at which the slide layer is intended to have smallest the particle diameter and the greatest hardness. The temperature of the substrate to be coated and the growing slide layers is kept advantageously throughout the process within a range between $-10°$ and $190°$ C., that of the site, at which smallest particle diameter and greatest hardness of the slide layer is sought between $-10°$ and $+70°$ C. This approach is based on the surprising findings, that a decrease of the substrate temperature during cathode sputtering leads to an unexpected large decrease of the mean diameter of the particles insoluble in the matrix and therefore to a corresponding increase of the hardness of the slide layer at the particular sites, which goes hand in hand with fatigue limit under reversed stress and corrosion resistance.

Apart from this reduction of the coating temperatures an increased, coating rate over 0.2 μm/minute contributes to the fine distribution according to the invention of the insoluble component. This connection can be specifically exploited in those situations, in which insufficient quantities of cooling water for carrying out the method is available. This method provides that the different materials of the slide layer, thus, specifically material forming the matrix and the one soluble in the matrix are applied simultaneously through cathode sputtering on the substrate, which, in addition, improves the fine distribution of the insoluble component according to the invention. This can be accomplished preferentially in that more than half the targets used in the process contain the primary component of the matrix as well as the material insoluble in the matrix. Corresponding to the composition of the desired slide layer, specifically alloys with the following composition can be used: AlCuSn, AlCuPb, AlSiSn, AlSiPb, AlSiSnPb, CuSn, CuPb, CuSnPbb.

In another modification of the method the different component of the slide layer are applied on the substrate time-sequentially. For this, advantageously targets of the main components of the slide layer, for example, pure aluminum and pure tin are employed and sputtered at different positions of the particular coating device. Particularly effective can be the use for generating the diffusion blocking layer and the slide layer the same targets and to form the two different layers immediately one after the other on the workpieces to be coated. In a further variant of the method according to the invention the temperature of the substrate is varied in the sense, that the matrix-forming component is applied at higher temperatures than the component insoluble in the matrix. In a further variant this can take place in such a way that the matrix-forming component of the slide layer is applied at increased substrate temperatures preceding that of the insoluble component and the temperature during the coating process is decreased. Further possibilities for varying the method according to the invention result from the fact, that the voltage which is applied to the substrate to be coated is varied corresponding to the given requirements of the concrete application. This can best be carried out in that the components with the highest melting points, perhaps the matrix-forming component or the primary component of the diffusion blocking layer, is applied at a higher voltage than the component insoluble in the matrix with the lower melting point. The oxygen required for oxygen doping can be introduced either in the form of a gaseous substance during the process of cathode sputtering into the plasma gas or before the cathode sputtering process in the form of oxides of the elements contained in the matrix-forming materials in the target utilized for this purpose or a part of the target used here. In the first case the gaseous substances to be used are primarily elemental oxygen itself or air, although in particular applications oxygen compounds of one of the following elements or of combinations of these elements can be utilized: hydrogen, carbon, nitrogen. Of these oxygen compounds water vapor and $CO_2$ have probably the greatest practical significance for the here discussed oxygen doping. Customarily, in this variant during the coating process through cathode sputtering in the vacuum changer of the device, a partial pressure of the oxygen-supplying gas of 1 to 50% of the total pressure of the gas mixture is maintained with argon being preferentially used as further component of this mixture.

According to a second variant the oxygen required for the specific apportioning is deposited as oxide in the target used for cathode sputtering or a part of the utilized target. This offers the possibility of controlling the degree of oxygen doping of the slide layer over this oxide content of the target or over the electrical power density of it during the cathode sputtering. This can specifically take place in that the particular target for the purpose of setting the requisite oxygen concentration is subjected before the cathode sputtering to a combination of vacuum and heat treatment in an oxygen-containing atmosphere. An alternative method consists in the specific addition of oxide powder, for instance $Al_2O_3$, in the manufacture of the targets, be it in continuous casting or by way of pressing and sintering pulverized metals. In accordance with the preferred matrix-forming materials these are primarily the oxides of the following elements: aluminum, chromium, nickel, magnesium, copper, tin, indium, lead, zinc.

The composite materials according to the invention can be successfully employed in friction bearings of any kind. The bearing shells used in such slide layers are provided with the slide layers according to the invention as surface layers such that this slide layer at the top of the bearing shell has the smallest mean particle diameter of the insoluble component and hence the greatest hardness and in the region of the seam with the matching shell the largest mean particle diameter and hence the least hardness. At the top of the bearing shell the slide layer must have a hardness of more than 100 HV 0.002, in order to absorb the surface pressures of the connecting rods. Slide layers according to the invention can be used for bearing loads between 80 and 120 $N/mm^2$ and at temperatures of the bearing back between 150° and 200° C.. Under these conditions the layers according to the invention did not show any measurable wear and tear after continuous load testing for 720 hours.

Accordingly it is an object of the invention to provide a composite material which has at least one cathode sputtering applied slide layer of a mixture of particles deposited in a statistical distribution of at least one tightly cohesive metallic material forming a matrix and at least one additional metallic material in a solid state which is substantially insoluble in the matrix material and with the diameters of the particles of the metallic material which are insoluble in the matrix having gradients at predetermined locations which extend parallel to the surface of the slide layer and to which correspond gradients of the hardness of the slide layer.

A further object of the invention is to provide a method of manufacturing composite materials by cathode sputtering with at least one slide layer of a mixture of statistically distributed particles of at least one material performing a matrix material and at least one additional material insoluble in the matrix material which comprises maintaining layer temperature gradients while cathode sputtering to form a slide layer which grows on the substrate to be coated and wherein the temperature gradients are maintained so as to extend parallel to the surface of the substrate.

A further object of the invention is to provide a use of composite materials such as set forth in the method in a friction bearing shell particularly for dynamically high stressed bearing.

A further object of the invention is to provide a bearing or similar slide layer which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 2 is a cross section through a radial friction bearing (connecting rod bearing) of a high-speed internal combustion engine with bearing shells of the composite material according to the invention.

DESCRIPTION OF THE PREFERRED EMBODIMENTS

Figure 1:
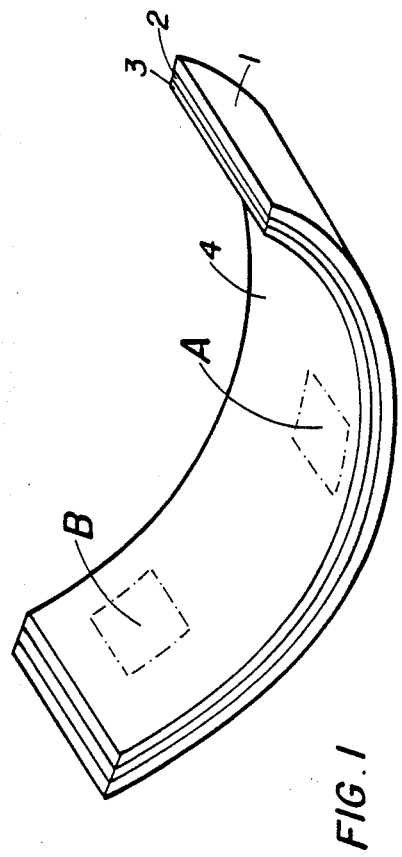
FIG. 1 is a schematic perspective view of a formed part of the composite material according to the invention.
Figure 1B:
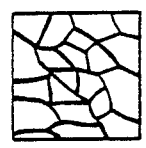
FIG. 1A and FIG. 1B are microscopic hardeners gradient views at locations A and B of FIG. 1.
Figure 1A:
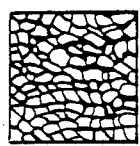
Figure 3:
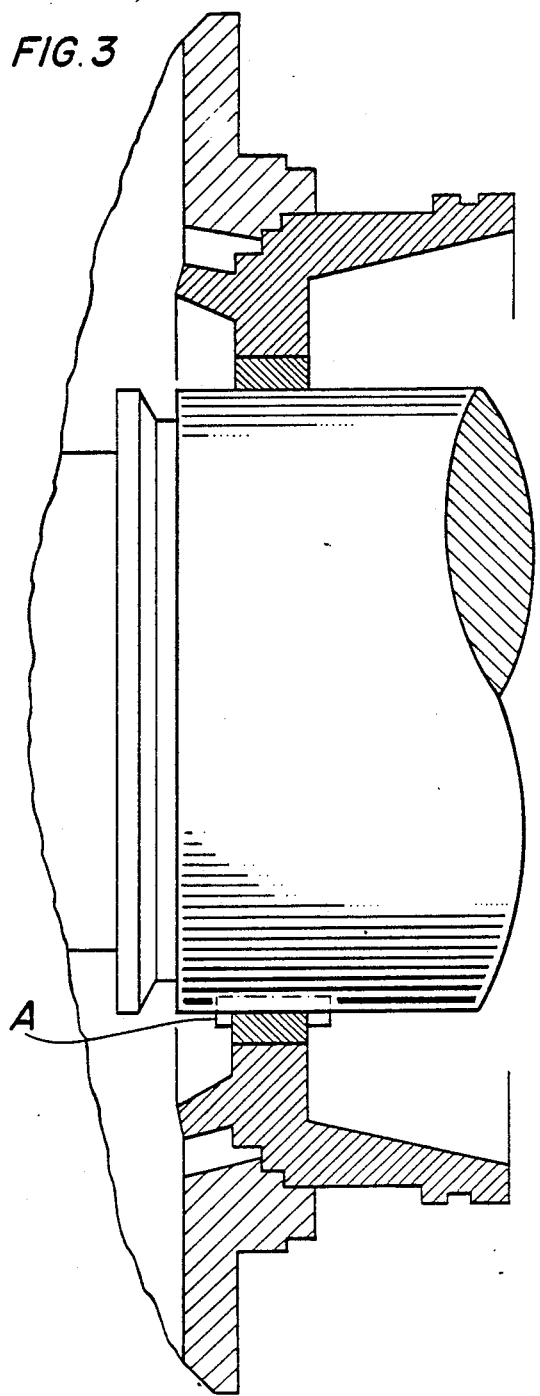
FIG. 3 is an enlarged axial sectional view of the shaft bearing.

Referring to the drawings in particular, the invention relates to articles which have sliding surfaces and to a composite material having a slide layer which is applied by cathode sputtering.

In the model of FIG. 1, on a steel back (base material) 1 a carrier layer 2 of a material having good emergency running properties of layer thickness from 200 to 700 μm is applied. If for this carrier layer 2 a lead or lead/tin bronze is used, this layer has a hardness between 50 and 100 HV 0.002. Onto this carrier layer 2 a thin diffusion blocking layer 3 having a layer thickness of customarily a few μm (2–4 μm) is applied through cathode sputtering. This diffusion blocking layer comprises one or several elements of the matrix-forming material of the slide layer, for example, nickel, chromium, or an alloy thereof. Onto this blocking layer 3 the slide layer 4 according to the invention is applied through cathode sputtering. The particle size of the insoluble component differing due to the temperature gradients during the cathode sputtering process is shown in the enlarged details A and B, with Section A corresponding to a finely distributed part with high surface hardness, section B a part with greater mean particle size and correspondingly decreased surface hardness. Accordingly, the hardness gradient in slide layer 4 extends from section A to section B.

In FIG. 2 use of the composite material according to the invention as bearing shells in a radial friction bearing (connecting rod bearing) of a high-speed internal combustion engine is shown. The connecting rod 11 converts its motion into a rotational motion of a crankshaft, consisting of crankshaft journal 12, journal 13 and two different crank arms 14 and 15. Between the split lower connecting rod big end 16 and the rotating crankshaft journal 12 two semi-cylindrical bearing shells of the composite materials according to the invention are set in and the fit secured with the connecting rod screws 17. The slide layer 4 of the bearing shells, consequently, is in contact with the crankshaft journal 12 and the steel back 1 rests on the connecting rod big end 16.

In this arrangement sections A at the top of the bearing shells need high load bearing ability in order to absorb the surface pressure of the connecting rod, and therefore have a fine distribution of the insoluble phase as shown in FIG. 1. In contrast, of section B at the transition to the matching shell good embedding properties for abrasion and dirt particles are demanded, which can be achieved through appropriate lesser surface hardness and coarser distribution of the insoluble component. In both bearing shells, consequently, two hardness gradients according to the invention each exist between sections A and B.

For generating the composite material according to the invention, for example, the following reaction conditions were maintained:

EXAMPLE 1

Coating was carried out in a cathode sputtering device known per se, in which an annular dense plasma was concentrated with a magnetic field directly before the cathode. The installation had a cylindrical process chamber, at the outside of which up to a maximum of four sources of 322.6 cm² could be vertically mounted. The substrates to be coated were likewise placed vertically on a carrier, which could be rotated by a drive variable between 0.2 and 24.5 rotations per minute (cf. for example,. BALZERS Produktinformation BB 800 246 PD/August 1985 as well as BB 800 039 RD/July 1985).

Bearing shells of non-alloyed tool steel (material No. 1.1625, short (80W2) having a lead bronze (CuPb 23Su4) carrier layer of 200 μm applied in sintering process were coated in this sputtering installation at a pressure of 1.2 Pa in argon under complete absence of oxygen for 8 hours. A separate cooling line took care that the top (section A in FIG. 1) was cooled exclusively. This measure produced at this place a substrate temperature of 30 °C., while the temperature in the direction of section B of the bearing shell increased and at both ends of the bearing shell was between 170° and 190° C. To maintain this temperature at the top of the bearing shells 0.005 m³ cooling water (~10° C.) was required per hour and per bearing shell to be coated.

As targets, on the one hand, pure aluminum (99.99) was used at a voltage of 470 Volt, on the other hand, a tin bronze of composition SnCu5 at a voltage of 620 Volt was used and run with a power density of 20 kW/322 cm² respectively of 10.3 kW/322 cm². Upon rotation of the substrate at a constant rate of rotation of 15 rotations per minute, a coating rate of approximately 0.3 m/Min corresponding to a layer thickness of approximately 150 m was achieved at the end of the treatment.

The layer generated in this manner had a weight ratio of Al:Sn:Cu of 80:20:1 (corresponding to the composition AlSn20Cu1) and an oxide content of less than 0.2 weight percent. At the bearing top a mean particle diameter of approximately 0.3 μm and at the ends of the bearing shells one of approximately 5 μm was obtained. The hardness was 113 HV 0.002 at the bearing top (section A) and 45 HV 0.002 at the ends of the bearing shells (section B). This hardness decreases upon exposure to air at 170° C. for 250 hours only to approximately 92 HV 0.002. When tested on the bearing testing machine for 250 hours, a load of 70 N/mm² and a bearing back temperature of T=160° C. these layers showed no measurable wear and tear.

EXAMPLE 2

The processing conditions of Example 1 were varied in the sense that initially for 1½ hours only the targets of an AlSi alloy (Al+0.1–2% Si) were turned on and the bearing shells cooled to a uniform temperature of 120° C. Subsequently, the two other targets of the tin bronze were connected and the cooling set so that it fell at the top of the bearing shells to 20° C., at the ends of the bearing shells to 80° C. The remainder of the coating process was carried out under the conditions given in Example 1.

It yielded a hardness of the slide layer at the bearing top (section A) of 130 HV 0.02 and one of 45 HV 0.02 at the two ends of the bearing shells (section B).

EXAMPLE 3

The processing conditions of Example 1 were modified in that in the process chamber of the cathode sputtering installation a pressure of 1.2 Pa in the argon was maintained, to which 5.0 volume percent oxygen was added. In contrast to the layer obtained according to Example 1, the layer generated under these conditions had an oxygen content of 1.89 weight percent. To this corresponded a hardness of 160 HV 0.002 at the bearing top (section A in FIG. 1) and one of 35 HV 0.002 at the edges of the shell (section B in FIG. 1). The response of the layer during testing on the bearing test machine corresponded to that of the slide layer produced in Example 1.

EXAMPLE 4

Bearing shells of the same tool steel (material No. 1.1625) having a 200 m thick carrier layer of CuPb23Sn4 (lead bronze) applied by immersion were coated in the absence of oxygen in the plasma gas under the same condition as in Example 1. The quantity of water here was 0.035 m$^3$ per hour and per bearing shell to be coated. To apply the slide layer the following targets and power densities were used: a target tin (10.3 kW/322 cm$^2$), a target lead (11 kW/322 cm$^2$) as well as 2 targets AlSi with changing concentrations of Al$_2$O$_3$ (1-5 weight percent) and changing electrical power density (20-120 kW/322 cm$^2$).

This yields a slide layer of the approximate composition AlSi45Sn15Pb20, the oxygen content of which could be set by varying the oxide content as well as the electrical power density of the target during the sputtering process. When two targets were used with an oxide concentration of 5% Al$_2$O$_3$ at a power density of 20 kW/322 cm$^2$, for example, a final concentration of 0.7 weight percent oxygen in the layer was obtained, at one of 80 kW/322 cm$^2$ an oxygen concentration of 1.2 weight percent was obtained. These layers had at the top of the bearing shells a mean particle diameter of 0.2 $\mu$m and at the edges of it one of 5 $\mu$m. Their hardness accordingly was between 165 HV 0.002 (section A) and 50 HV 0.002 (section B).

EXAMPLE 5

The process conditions of Examples 1 to 4 can be varied so that the bearing shells before the application of the slide layer are provided with a thin diffusion blocking layer (FIG. 1: position 3). For this purpose only the two targets of the AlSi alloy are turned on (20 KW/322 cm$^2$) for 12 minutes and at 30 ° C. The layer thickness of the diffusion blocking layer generated in this way was approximately 2 $\mu$m. Subsequently, the other targets are connected and the coating completed under the same conditions as in Examples 1 to 4.

While specific embodiments of the invention have been shown and described in detail to illustrate the application of the principles of the invention, it will be understood that the invention may be embodied otherwise without departing from such principles.

What is claimed is:

1. A composite material, comprising at least one cathode sputtering applied slide layer surface of a mixture of particles deposited in a substantially predetermined distribution of at least one cohesive metallic material forming a matrix, and at least one additional metallic material in the solid state, said additional metallic material having particles substantially locked in the matrix material, said locked particles having a diameter which changes at predetermined locations said predetermined locations extending parallel to the surface of the slide layer, said slide layer having a hardness which changes corresponding to the change of the diameter of particles at said predetermined locations thereby providing locations with particles of small mean particle diameter of high hardness and good load bearing ability and locations with particles of larger mean particle diameter with a lower degree of hardness corresponding to good embedding capacity.

2. A composite material according to claim 1, wherein the mean distribution of the diameter of the locked particles adjacent said predetermined locations assumes values between 0.2 $\mu$m and 10 $\mu$m.

3. A composite material according to claim 1, wherein said additional metallic material which is locked in the matrix contains as main component at least one of the following elements: tin, lead, indium, zinc.

4. A composite material according to claim 1, wherein the matrix forming material contains an alloy, the main component of which is at least one of the following elements: aluminum, chromium, nickel, magnesium, copper.

5. A composite material according to claim 1, wherein one of said predetermined locations has a degree of hardness which is higher than the degree of hardness of other of said predetermined locations, the diameter of the particles of the locked material at the predetermined location of the slide layer having the highest degree of hardness has a distribution of locked particles with a mean diameter e,ovs/x/ value of $\bar{x} \leq 0.8$ $\mu$m.

6. A composite material according to claim 1, wherein the slide layer has an oxygen content, the oxygen content of said slide layer being below 0.2 percent by weight.

7. A composite material according to claim 1, wherein the slide layer has an oxygen content, the oxygen content in the slide layer being between 0.5 and 2.0 percent by weight.

8. A composite materials as stated in claim 1 wherein the composite material is used in friction bearing shells wherein the slide layer at a top portion of the bearing shell has the smallest mean particle diameter of the locked component and therefore the greatest hardness, and the slide layer of a bottom portion of the bearing shell has the largest mean particle diameter of the insoluble component and therefore the least hardness.

9. A composite material as stated in claim 8, wherein the slide layer at the top of the bearing shell has a hardness of more than 60 HV 0.002.

10. A composite material according to claim 5, wherein the mean diameter value X is between 0.5 and 0.4$\mu$.

* * * * *